(12) United States Patent  
Takeshita et al.

(10) Patent No.: US 7,063,510 B2  
(45) Date of Patent: Jun. 20, 2006

(54) CENTRIFUGAL FAN

(75) Inventors: Kazumi Takeshita, Kyoto (JP); Junpei Kitamura, Kyoto (JP)

(73) Assignee: Nidec Corporation, Kyoto (JP)

( * ) Notice: Subject to any disclaimer, the term of this patent is extended or adjusted under 35 U.S.C. 154(b) by 74 days.

(21) Appl. No.: 10/711,415

(22) Filed: Sep. 17, 2004

(65) Prior Publication Data

US 2005/0058543 A1    Mar. 17, 2005

(30) Foreign Application Priority Data

Sep. 17, 2003   (JP)   ............................. 2003-324485

(51) Int. Cl.  
    *F03D 11/00*    (2006.01)
(52) U.S. Cl. .................. 416/210 R; 415/206; 416/226; 416/235
(58) Field of Classification Search ................ 415/206, 415/182, 185, 210 R, 226, 234, 235  
    See application file for complete search history.

(56) References Cited

U.S. PATENT DOCUMENTS 6,348,748 B1    2/2002   Yamamoto 6,568,907 B1    5/2003   Horng et al.

FOREIGN PATENT DOCUMENTS

| JP | 2000-341902 A | 12/2000 |
|---|---|---|
| JP | 2001-135964 A | 5/2001 |
| JP | 2001-140790 A | 5/2001 |
| JP | 2001-182691 A | 7/2001 |
| JP | D1118546 | 8/2001 |
| JP | 2002-021782 A | 1/2002 |

*Primary Examiner*—Edward K. Look  
*Assistant Examiner*—Dwayne J White  
(74) *Attorney, Agent, or Firm*—James Judge

(57) ABSTRACT

Slim-profile centrifugal fan made up of a housing, a motor component, and a airflow-generating component. A disk portion, a cylindrical portion, a plurality of posts, and a plurality of blades compose the airflow-generating component. The plurality of posts project from, and are arranged at a predetermined circumferential spacing along, the outer circumferential surface of the cylindrical portion; and each of the plurality of blades is provided on a respective one of the posts. The posts are of sufficiently greater thickness than the blades. Accordingly, air spaces are formed in between the posts and the blades, yet the blades are retained firmly on the cylindrical portion by the posts.

16 Claims, 9 Drawing Sheets

CENTRIFUGAL FAN

BACKGROUND OF INVENTION

1. Technical Field

The present invention relates to centrifugal fans of slim-profile design.

2. Background Art

In information devices such as notebook computers, because the electronic components such as the CPU generate heat during operation, in order to cool the components the devices are generally furnished with cooling fans. In recent years, as the performance of information devices has been enhanced, the amount of heat issuing from the electronic components in the devices has tended to increase. Because such electronic components cannot operate normally if too much heat is generated, cooling performance corresponding to the amount of heat produced must be demonstrated. Meanwhile, in response to consumer demands for portability, compactness, and similar features, information devices are being miniaturized or flattened, which has increased the density of the components inside the devices.

Accordingly, adequate cooling performance is demanded of cooling fans employed in such electronic devices, even in situations in which the fans are installed in confined spaces that, for example, are restricted in height. In the selection of cooling fans to be employed in such applications, centrifugal fans are known to be the best choice in general. The centrifugal fan illustrated in FIG. 6 of Japanese Unexamined Pat. App. Pub. No. 2002-21782, for example, is a case in point. "Centrifugal fans" herein are fans that suck in air along the rotational axis of the fan—or more precisely, along a vertical paralleling the rotational axis—and exhaust the sucked-in air orthogonally to the rotational axis, that is, radially outward.

In a centrifugal fan 1 as illustrated in FIG. 9 of the drawings accompanying the present specification, an airflow-generating part 2 that is molded as a unitary component from a synthetic resin is accommodated in a flat housing 4. A plurality of blades 2a radiates in extension from a cylindrical rotor 2b portion of the airflow-generating part 2. Air intake ports 10 and 12 are provided respectively in the top side 6 and bottom side 8 of the housing 4, and an exhaust port 14 is provided in a portion of the lateral side of the housing 4. (Some implementations have only either the upper or the lower of the intake ports 10 and 12.)

This centrifugal fan 1 is configured with the top and bottom edges of the blades 2a in close proximity to the top side 6 and bottom side 8 of the housing 4 in order that the structure of the fan have a slender profile. A further aspect of the fan configuration is that the radially inward portion of the top and bottom edges of each blade 2a is cut away to form airways 16 and 18. Thus, through these airways 16 and 18, a large volume of air is drawn from the exterior into the interior of the housing 4. This configuration enables the realization of desired air-delivery characteristics in the centrifugal fan 1, despite its slim-profile structure.

On the other hand, in this type of centrifugal fan 1, given the necessity of securing the airways 16 and 18, the vertical width of the blades 2a must be thin, which is prohibitive of guaranteeing the strength with which they are joined to the rotor portion 2b. The thinness of the airway-forming portions of the blades 2a makes the blades more prone to bending out of form, leading to greater fan vibration and noise and creating the risk that the air-delivery performance will falter. As an alternative to using the airways as a means to attain greater cooling capacity, the fan may be revved up; revving up the fan, however, increases the load on the portion of the blades 2a that joins to the rotor, running the risk that the blades themselves will break. Consequently, the realization of a cooling fan that can meet the information device requirements for high performance with slim-profile dimensions has been an elusive goal.

SUMMARY OF INVENTION

An object of the present invention is to realize favorable air-delivery characteristics in a centrifugal fan despite slim-profile dimensioning.

A centrifugal fan according to the present invention is made up of a housing, a motor component, and an airflow-generating component, and is characterized by an airflow-generating component that is anchored to the rotor portion of the motor component. The airflow-generating component is provided with a plurality of blades for generating a flow of air, with each blade anchored on a respective post provided on the cylindrical portion of the rotor. The provision of a post between each blade and the cylindrical portion of the rotor forms a gap. Accordingly, a flow of air is supplied to each blade via the gap. Further, not only does each post create a gap for air flow, each post is thicker than the attached blade. Thus, because the blades are firmly attached to the rotor via the thicker post, even if the motor spins at high speed, there is no risk of the fan failing to function properly because the blades vibrate or break. Thus, the centrifugal fan may be run at a higher rpm and improvement in its air-delivery characteristics can be achieved. This efficacy is especially pronounced in implementations in which the centrifugal fan is miniaturized or flattened for installation into information devices such as notebook computers.

From the following detailed description in conjunction with the accompanying drawings, the foregoing and other objects, features, aspects, and advantages of the present invention will become readily apparent to those skilled in the art.

DETAILED DESCRIPTION

Using FIGS. 1 through 6, a description of the first embodiment of the present invention will be presented.

Figure 1:
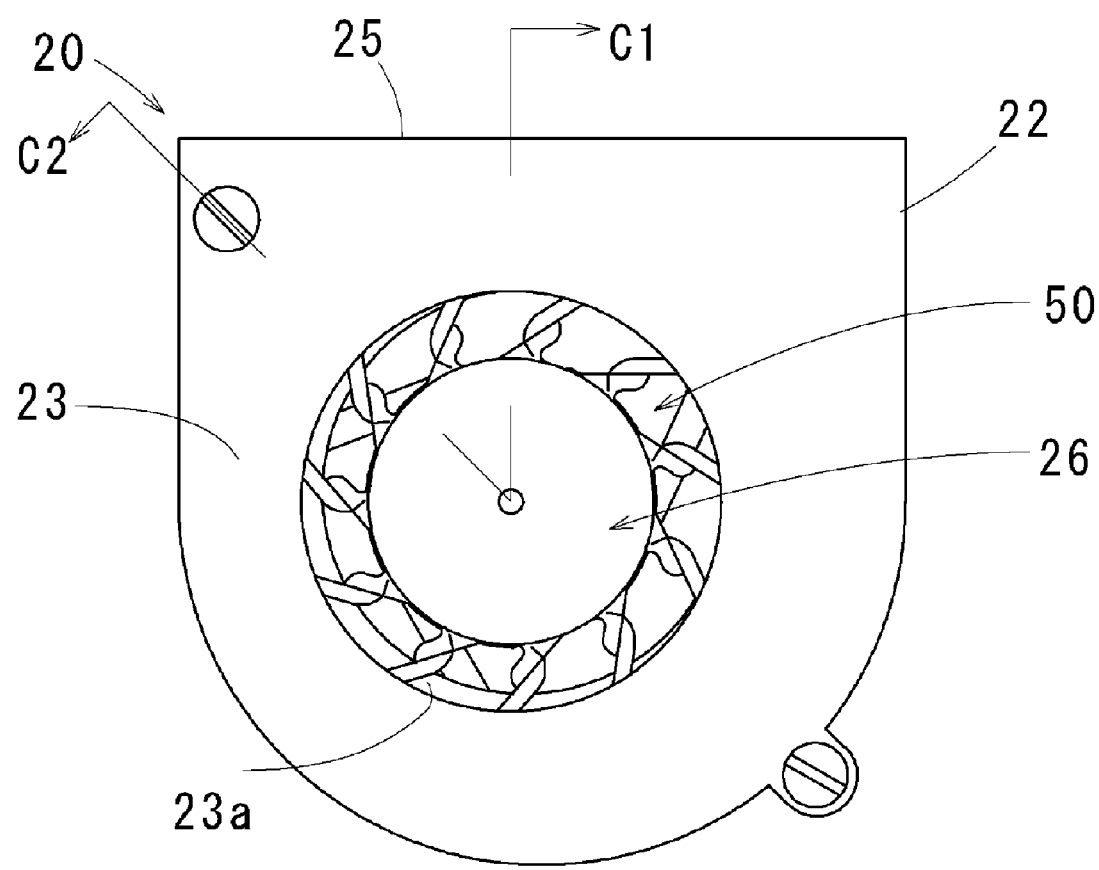
FIG. 1 is a plan view illustrating a centrifugal fan in a first embodiment of the present invention.
Figure 2:
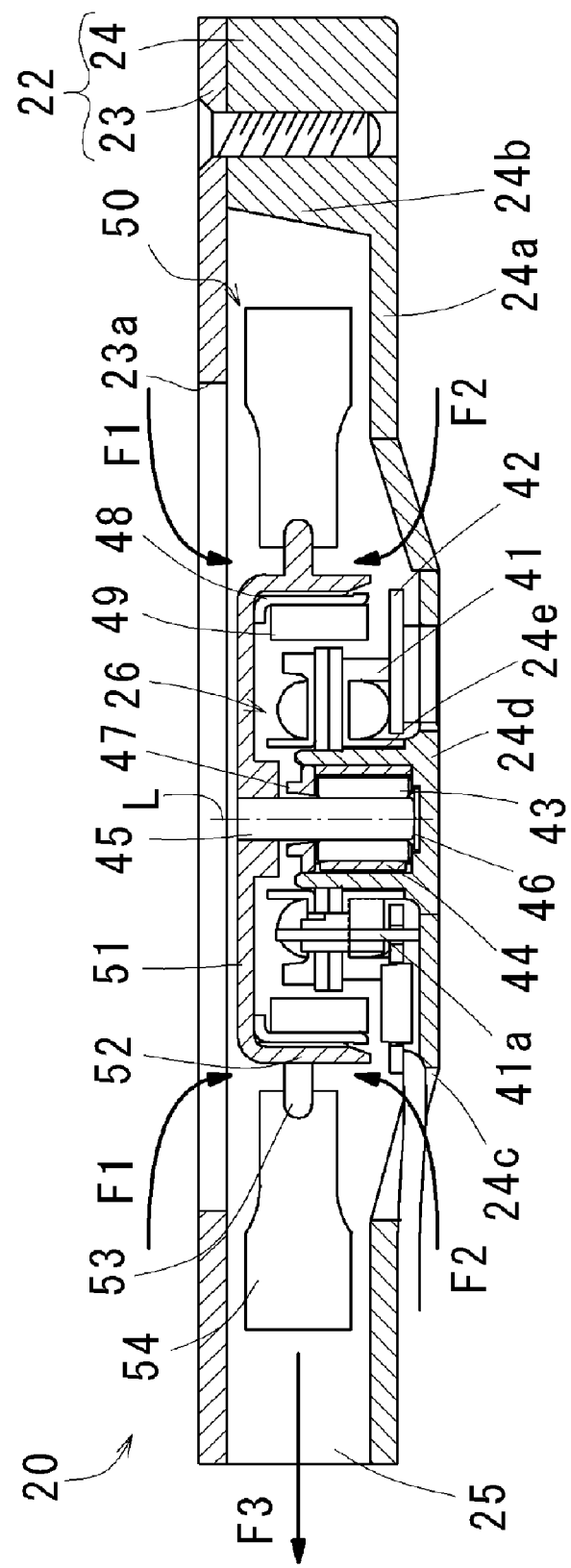
FIG. 2 is a sectional view along the sectioning lines C1 and C2 through the centrifugal fan in FIG. 1.

The principal parts making up the centrifugal fan 20 as illustrated in FIGS. 1 and 2 are: a housing 22, a motor component 26, and an airflow-generating component 50. The centrifugal fan rotates around a rotational axis L represented in FIG. 2.

The housing 22 is composed of two elements: a top-side plate 23 and a bottom-side plate 24, both of which are formed from a material of high thermal conductivity, such as aluminum.

The top-side plate 23 is a thin, semicircular sheet in the approximate center of which is a circular opening 23a. Two screw-holes for fastening this centrifugal fan to an information device or other appliance flank the opening 23a on diametrically opposed verges of the top-side plate 23.

The bottom-side plate 24 is made from a thin, semicircular sheet portion 24a of the same contour as the top-side plate 23, and includes a sidewall portion 24b that forms a U shape along the peripheral edge of the thin-sheet portion 24a. The sidewall portion 24b contains two screw-holes in positions that match the two aforementioned screw-holes in the top-side plate 23. Three arcuate apertures 24c open along a circle on the approximate center of the thin-sheet portion 24a. The circular part of the thin-sheet portion 24a that is surrounded by these apertures 24c supports the motor component 26. As shown in FIG. 2, this motor-support section 24d of the thin-sheet portion 24a dips down from the area where the thin-sheet portion 24a is located around the perimeter of the three apertures 24c. Because the motor support section dips down in this manner, even if the centrifugal fan 20 abuts the bottom surface of the information device into which it is loaded, the area alongside the apertures 24c in the thin-sheet portion 24a will not be closed off.

To create the housing 22 the top-side plate 23 is set on the face of the upper edge of the sidewall portion 24b and is affixed to the face with adhesive, thus forming a box with a hollow interior. The opening 23a, described above, is an air intake port through which air is drawn into the fan's interior from along the top side of the housing 22; the plurality of apertures 24c are air intake ports through which air is drawn into the fan's interior from along the bottom side of the housing 22 (both the opening 23a and the apertures 24c will be referred to as intake ports hereinafter). The rectangular opening 25 formed by the linear portion of the top-side plate 23 and the linear portion of the bottom-side plate 23 across which the sidewall portion 24b does not extend is an exhaust port through which the airflow in the interior of the housing 22 exhausts to the fan exterior. (The opening 25 will be referred to as an exhaust port hereinafter.)

The motor 26 is a rotational drive means composed of a stationary assembly and a rotary assembly. In the stationary assembly, a stator 41 is snugly fitted against the outer circumferential periphery of a cylindrical portion 24e that extends from the above-described motor-support section 24d into the interior of the housing 22, and a circuit board 42 in between the stator 41 and the motor-support section 24d is retained via a metal pin 41a provided on the stator 41.

A sleeve bearing 43, made of a porous, oil-impregnated metal in cylindrical form, is snugly fitted along the inner circumferential periphery of the cylindrical portion 24e by pressure-insertion via a cylindrical spacer 44 made of a synthetic resin. Because the spacer 44 contracts slightly, the sleeve bearing 43 is securely anchored without either the sleeve bearing 43 or the cylindrical portion 24e becoming deformed. Via a lubricant, the sleeve bearing 43 supports loads that act radially on a shaft 45 that is a constituent of the rotary assembly.

The lower-end face of the shaft 45 turns by sliding on a round thrust plate 46, made from a highly lubricative resin, that is carried on the bottom surface of the cylindrical portion 24e. The thrust plate 46 supports loads that act downward on the rotary assembly. A ring member 47 that is L-shaped in cross-section is fixed to the upper surfaces of the sleeve bearing 43 and the spacer 44. The ring member 47 covers the upper-edge face of the sleeve bearing 43, and by surrounding the circumferential surface of the shaft 45, it prevents lubricant from leaking from the sleeve bearing 43.

In the rotary assembly, the shaft 45, which is made of metal, is snugly fitted into the sleeve bearing 43, abuts on the thrust plate 46, and is reinsertable; the airflow-generating component 50 is provided on the upper-end portion of the shaft 45.

Figure 4:
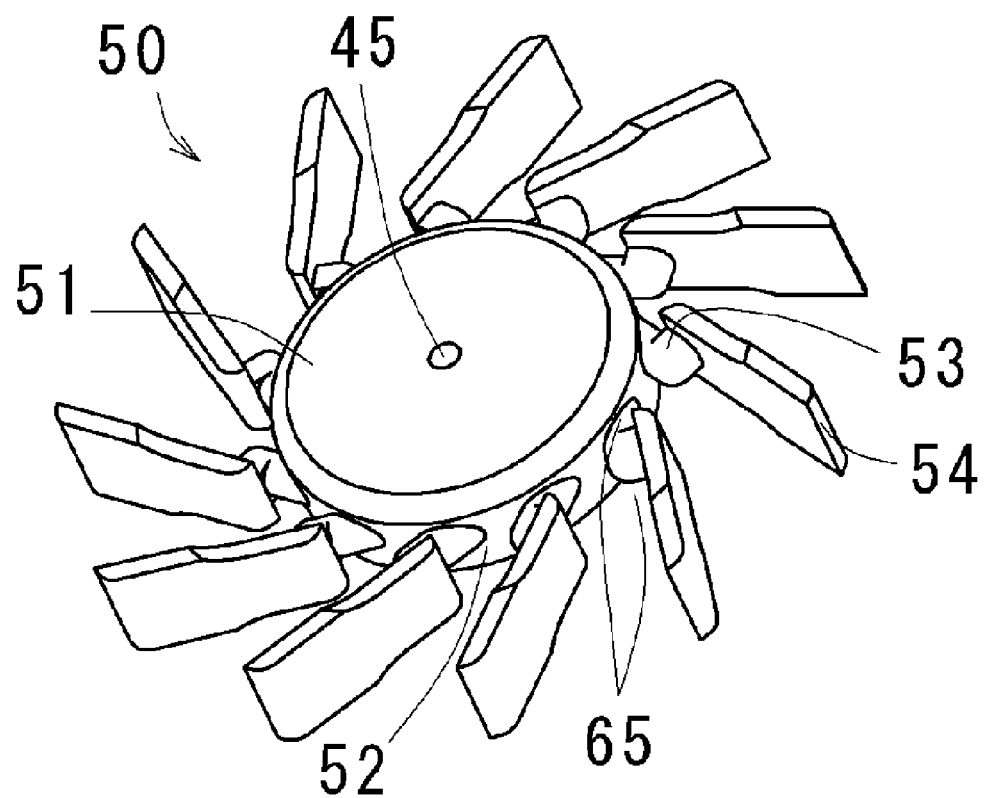
FIG. 4 is an oblique view illustrating an airflow-generating component of the centrifugal fan in FIG. 1.
Figure 5:
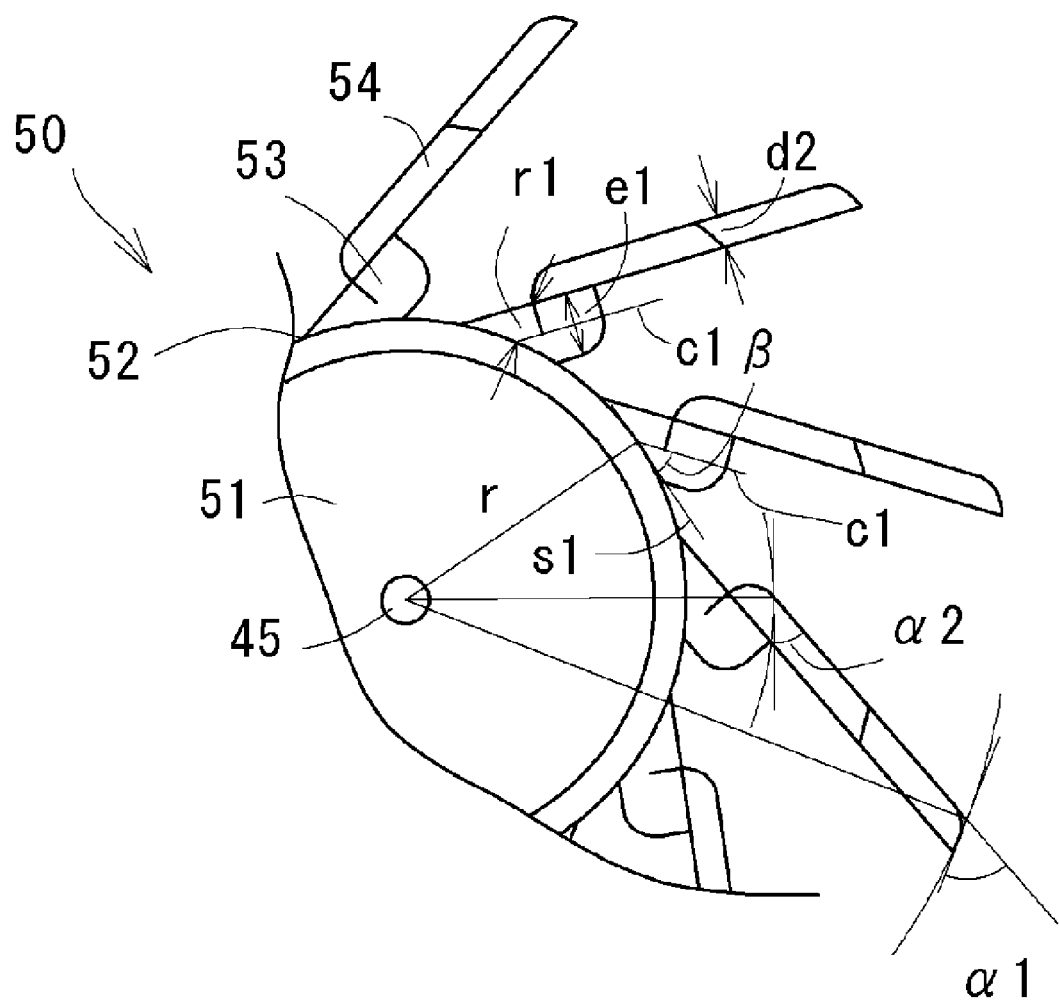
FIG. 5 is a fragmentary plan view of the airflow-generating component in FIG. 4.
Figure 6:
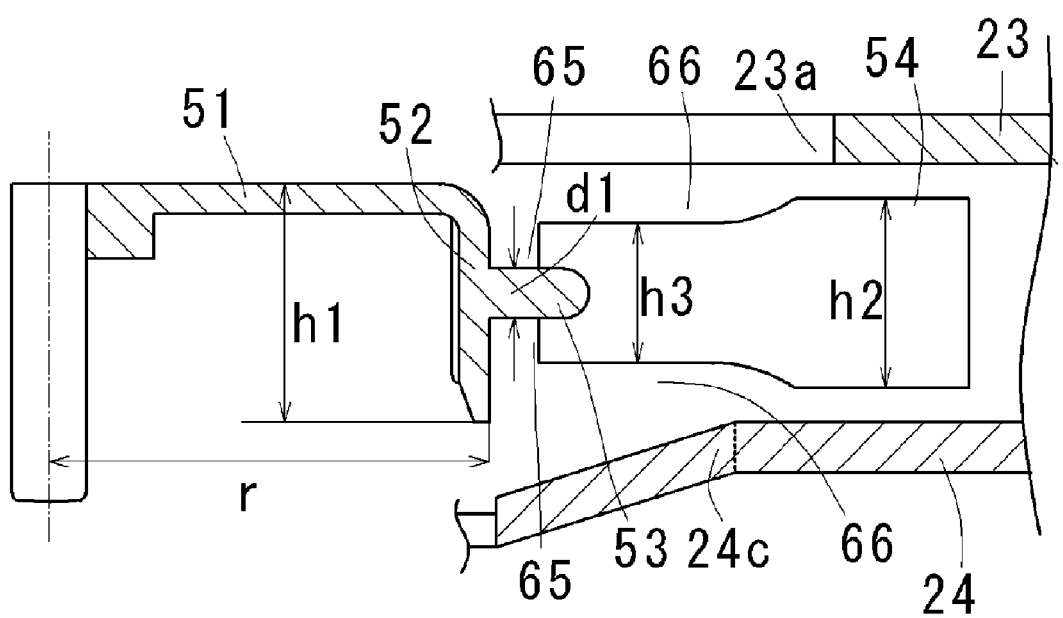
FIG. 6 is a fragmentary side view of the centrifugal fan, illustrating key features of the airflow-generating component in FIG. 4.

The airflow-generating component 50, as illustrated in FIGS. 4, 5 and 6, is made up of: a circular disk portion 51 that is centered on the shaft 45; a cylindrical portion 52 that extends down from the rim of the disk portion 51; a plurality (eleven in this embodiment) of posts 53, projecting orthogonally to the fan rotational axis L, that are evenly spaced circumferentially on the surface along the outer periphery of the cylindrical portion 52; and a plurality of blades 54, extending at right angles to the rotational axis L, that are provided on the posts 53. A plurality of ribs parallel to the rotational axis L is evenly spaced circumferentially along the inner circumferential surface of the cylindrical portion 52. As indicated in FIG. 6, the radius r of the circle formed by the outer cylindrical surface of the cylindrical portion 52 measures approximately twice the height h1 of the cylindrical portion 52. The majority of the aforesaid motor component 26 is housed in the space surrounded by the cylindrical portion 52 and the disk portion 51. Because the disk portion 51, the cylindrical portion 52, the posts 53, the blades 54, and the shaft 45 are molded as a unit, the airflow-generating component 50 is easy to form, and the right angle between the airflow-generating component 50 and the shaft 45 is easy to produce.

A yoke 48, in cylindrical form and made from a ferromagnetic metal is snugly affixed to the ribs along the inner circumferential surface of the cylindrical portion 52 via pressure insertion against the ribs. A cylindrically-shaped magnet 49 is fastened with adhesive to the inner periphery of the yoke 48. The magnet 49 opposes the outer periphery of the stator 41 across an air space. The height of the yoke 48 with the attached magnet 49 is equal to the height of the cylindrical portion 52. Because the yoke 48 and the magnet 49 in their entirety, as well as the crucial portion of the stator 41, are disposed in the space that is surrounded by the cylindrical portion 52 and the disk portion 51, the configuration of the motor component 26 is flat.

In the motor component 26, a rotational magnetic field is induced in the stator 41 when an electric current is supplied to the stator 41, and by means of the effect that the rotational magnetic field from the stator 41 and the magnetic field from the magnet 49 have on each other, the rotary assembly rotates.

By positioning the magnet 49 so that its magnetic center is above the mechanical center of the stator 41, the magnet 49 continuously exerts an urging magnetic force downward; when this force is present, the shaft 45 cannot come out of the sleeve bearing 43.

As illustrated in FIG. 5, the posts 53, circularly columnar in form, project so that the angle $\beta$ formed by the center axis $c_1$, defined along the direction in which the posts 53 project, and the tangent line $s_1$ at the point where the center axis $c_1$ intersects the circle defined by the perimeter of the cylindrical portion 52, will be approximately 40 degrees; and, as illustrated in FIG. 6, the posts 53 are located in about the center of the height of the cylindrical portion 52. In other words, the posts 53 are positioned to be at a predetermined angle with respect to a line extending the cylindrical portion 52 radius that passes through the intersection of the center axis c1 and the outer circumferential surface of the cylindrical portion 52 in the plane containing the center axis c1 and the radius. This configuration, when compared with a configuration that does not position the posts at a predetermined angle with respect to the radial line, provides a greater surface area for joining the posts 53 to the cylindrical portion 52, which enables the posts 53 to be firmly anchored to the cylindrical portion 52.

As illustrated in FIGS. 5 and 6, the blades 54 are approximately rectangular plates of even thickness, and the height of the blades does not extend beyond the height of the cylindrical portion 52 (and thus is within the height h1 in FIG. 6). The blades 54 are provided on the lateral face, which is parallel to the rotational axis L, of the projecting end of the posts 53, and are parallel to the center axis c1 of the posts 53. The shortest separation r1 between the inner-diameter edge of the blades 54 and the outer circumferential surface of the cylindrical portion 52 is about one-tenth the radius r of the cylindrical portion 52. The exit angle $\alpha 1$ of the blades 54 is approximately 60 degrees, while the entrance angle $\alpha 2$ is approximately 40 degrees. In order to ensure a strong joint between the posts 53 and the blades 54, the joint is designed so that the surface area of the joint is the same as the area of the section in a sectioning plane through the post that is orthogonal to the post's center axis c1. Therefore, the joint between the posts 53 and the blades 54 fills the entire area formed between the outer peripheral surface of the posts 53 and the flat surface of the blades 54.

Because the airflow-generating component 50 configured as described above is designed to have a cylindrical portion 52 whose radius r is approximately twice its height h1, and is also designed so that the height of the blades 54 is not greater than the height of the cylindrical portion 52, the airflow-generating component 50 is lent a flattened configuration. Via the posts 53, the blades 54 are in a position that is parted off the cylindrical portion 52 at a radial separation (of length r1), thus forming spaces 65 for air above and below the posts 53 and in between the surface of the blades 54 that are angled rearward relative to both the direction R (FIG. 3) in which the fan rotates and to the outer circumferential surface of the cylindrical portion 52.

However, it should be understood that the posts 53 do not have to be in the form of round columns whose cross-section is a true circle—the cross-sectional contour of the posts 53 may be elliptical or of similarly curved form, or may be other than cycloid—but must be of a form by which the blades 54 are firmly supported while securing sufficient air space between the blades and the cylindrical portion 52. For that purpose, the posts 53 and the blades 54 have the following relationship: Letting the circumferentially directed width, orthogonal to the center axis c1 and at the same time orthogonal to the rotational axis L, of the posts 53 be the circumferentially circumscribed width e1, then the circumferentially circumscribed width e1 of the posts 53 is sufficiently greater than the thickness d2 of the blades 54 (FIG. 5); further, the height d1 of the posts 53 in the orientation of the fan's rotational axis is sufficiently smaller than the width h3 (FIG. 6) along the rotational axis in the vicinity of the portion of the blades 54 that is fixed to the posts 53 (equivalent to the height, as later described, of the blades 54 along their inner diameter). The circumferential width e1 preferably is at least double the blade thickness d2, while the rotational axial width h3 is at least double the rotational-axis oriented height d1.

The upper and lower edges of the blades 54 at a point longitudinally inward of roughly the lengthwise center of the blades are trimmed so as to taper diametrically inward for an extent and then level off. The height h3 of the blades 54, longitudinally inward, is less than the height h2 of the blades, longitudinally outward. (The blade area with the height h3 will be called the minor-width portion of the blades 54, and the blade area defined by the height h2 will be called the major-width portion of the blades 54.) Thus, in the airflow-generating component 50, air spaces 66 of height (h2−h3)/2 are formed respectively on the upper and lower sides of the minor-width portion of the blades 54. The maximum height of the blades 54 is h2.

The upper edge and lower edge of the minor-width portion of the blades 54 respectively oppose the intake port 23a in the top-side plate 23 and the intake ports 24c in the bottom-side plate 24 of the housing 22. The major-width portion of the blades 54 is (h2−h3)/2 closer to the top-side plate 23 and the bottom-side plate 24, respectively, than the minor-width portion. With this configuration, the motor 26 is disposed within the cylindrical portion 52 of an airflow-generating component 50 having a flattened conformation, lending a slim-profile structure to the centrifugal fan 20 as a whole.

Figure 7:
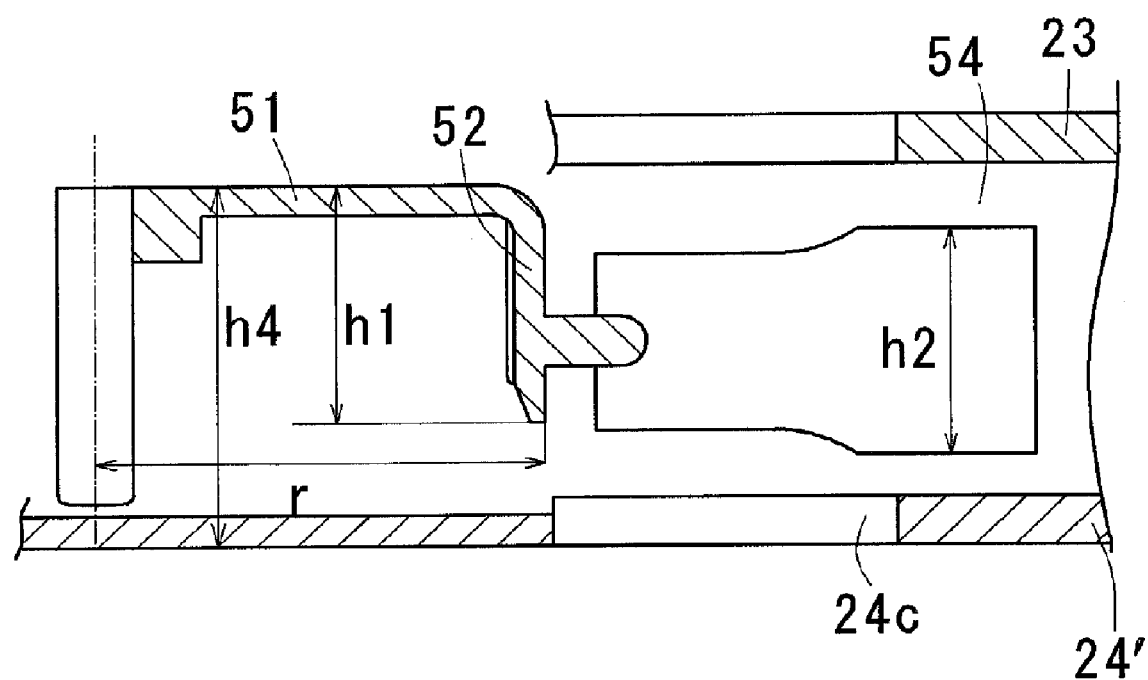
FIG. 7 is a fragmentary side view of a modified example of the centrifugal fan depicted in FIG. 1.

As stated above, the blades 54 are configured so that the height of the blades is not greater than the height h1 of the cylindrical portion 52; however, in an implementation in which the housing 22 is configured to be of height such that the portion of the bottom-side plate surrounding the motor support section leaves the motor support section protruding less from the bottom-side plate, or, as illustrated in FIG. 7, is configured to be of height such that the portion of the bottom-side plate 24' surrounding the motor support section is flush with the motor support section, the lower edge of the blades 54 may be extended by how much greater the height of the housing 22 where it surrounds the motor support section is, thus making the air space larger by that same amount. Likewise, if there is sufficient clearance between the blades 54 and the top-side plate 23, the upper edge of the blades 54 may be extended upward beyond the top surface of the disk portion 51. Thus, the height h2 of the major-width portion of the blades 54 (the maximum height of the blades 54) may be greater than the height h1 of the cylindrical portion 52. However, so as to maintain the slim-profile structure of the centrifugal fan 20, the maximum height h2 of the blades 54 preferably is less than the height h4 (FIG. 7) of the motor component 26, as it is preferable to have a configuration in which the blades 54 do not poke out beyond the height h4 of the motor component 26.

Figure 3:
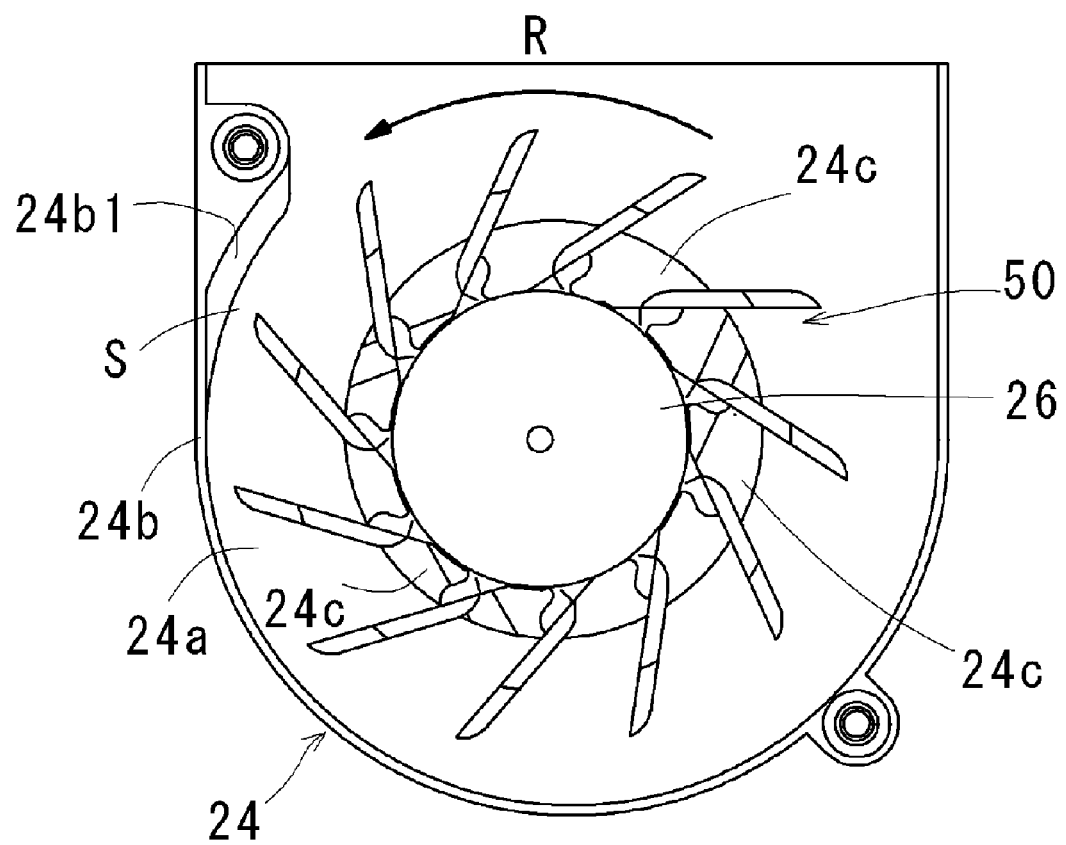
FIG. 3 is a view illustrating the internal structure of the centrifugal fan seen from above.

When the centrifugal fan 20 rotates in the counterclockwise direction indicated by the arrow R in FIG. 3, air is sucked in along the rotational axis L through both the intake ports 23a and 24c, from the exterior to the interior of the housing 22 (arrows F1 and F2 in FIG. 2). Air that has been drawn in is acted upon by the centrifugal force created by the blades 54, passes between neighboring blades 54, and is blown out in a direction orthogonal to the rotational axis L. The air blown out from the blades 54 is guided counterclockwise while colliding with the sidewall 24b and is blown out through the exhaust port 25 (arrow F3 in FIG. 2).

The centrifugal fan 20 is configured so that the distance between the outer edge of the blades 54 and the inner wall of the sidewall portion 24b gradually increases in the counterclockwise direction, with the region indicated by reference mark S in FIG. 3 being the minimum, and the region at the exhaust port 25 being the maximum. The air blown out from the blades 54 is exhausted with the static pressure within its flow through the interior of the housing 22 having been raised. Given that the outer edge of the blades 54 is parallel to the rotational axis L, because the inner peripheral surface 24b1 of the sidewall portion 24b is sloped as shown in FIGS. 2 and 3, in the region indicated by reference mark S, the radial separation between the blades 54 and the sidewall portion 24b expands in the upward direction. As a result, turbulence produced by the pressure differential that exists when air located upstream of the region S flows into the region S, and the noise stemming from that turbulence, are mitigated.

Because the centrifugal fan 20 has the air spaces 65 in between the cylindrical portion 52 and the blades 54, an annular airway along the inner-diameter side of the blades 54 is continuously provided. This annular airway formed by the air spaces 65 provides ample free-flowing air in the vicinity of both the intake port 23a and the intake ports 24c, wherein air is smoothly guided from the airway above and below the centrifugal fan 20 to the inner-diameter side of the blades 54. This annular airway allows the blades 54 to create a large volume of airflow, enabling the centrifugal fan 20 to demonstrate sufficient air-delivering capability.

The fact that the centrifugal fan 20 has, in addition to the air spaces 65, the air spaces 66 means that still more air is present that can flow freely along the inner-diameter side of the blades 54, and that air is all the more readily guided toward the blades 54.

Accordingly, despite what is, in terms of air fluidity, a disadvantageous configuration of the centrifugal fan 20 owing to its slim-profile structure with the top-side plate 23 and the bottom-side plate 24 being adjacent the upper and lower edges of the blades 54, with air being smoothly guided to the blades 54 through both the intake port 23a and the intake ports 24c, the desired air-delivery characteristics are nevertheless achieved. Further, even if the circumstances under which the centrifugal fan 20 is installed lead to obstacles in the environs of the intake ports 23a and 24c that hinder the passage of air, thanks to the air spaces 65 and 66 being secured, through the both the intake port 23a and the intake ports 24c, air can be supplied smoothly to the interior of the housing 22.

Furthermore, the blades 54 are supported on the cylindrical portion 52 by posts 53 of a thickness greater than that of the blades 54, yet sufficient spaces 65 and 66 between the blades 54 and the cylindrical portion 52 are provided. In addition, the rigidity of the blades 54 is great with respect to circumferential bending in which the fulcrum is where the blades 54 are fixed to the post 53, which holds the blades 54 firmly onto the cylindrical portion 52. For these reasons, the centrifugal fan 20 of the present invention makes possible rotation under conditions (for example, high-speed rotation) that, in conventional centrifugal fans, have made such rotation difficult to realize because of the concern that the blades 54 would be rendered in poor condition as a result.

With this centrifugal fan 20, there might be a concern lest the narrowing of the surface area of the blades 54 owing to the provision of the air spaces 65 and 66 compromise the fan's air-delivery efficiency. Nevertheless, because the peripheral speed of the blades 54 at the inner-diameter side is less than the peripheral speed at the outer-diameter side, if the air spaces are dimensioned as described in the present embodiment, there is almost no loss of air-delivery efficiency; indeed, the effectiveness gained by providing the air spaces 65 and 66 as described above is greater than any such loss. In addition, it will be appreciated that in implementations in which adequate air-delivery performance can be realized with the air spaces 65 only, the air spaces 66 may be omitted.

According to the above description, while having a slim-profile structure, the centrifugal fan 20, by eliminating incidents of poor operability or inoperability involving the blades 54 that result from excessive vibration or noise or breakage, enables the realization of excellent air-delivery characteristics over what has conventionally been the case.

By way of comparison, the fan disclosed in FIG. 2 of Japanese Utility Model Reg. No. 3,080,194 has, as with the centrifugal fan 20 of the present invention, air spaces in between a plurality of blades (reference numeral 33 in the figure) and a cylindrical part (reference numeral 32 in the figure), but the blades are provided on a ring plate (reference numeral 34 in the figure), and at the same time are provided on the cylindrical part via a plurality of ribs (reference numeral 35 in the figure) located on the inner-diameter side of the ring plate. Consequently, the fan configuration disclosed in the utility model publication is complex, which is prohibitive of molding the fan unitarily. And because the load from the blades and the ring plate acts on the ribs, which are thin, the higher the fan is revved, the greater the burden is on the ribs such that the fan is not suitable for high rpm operation.

Next, using FIG. 8, an explanation of a second embodiment of the present invention will be made. In this embodiment, an implementation in which the centrifugal fan 20 described above is installed in a compact, slim-profile information device such as a notebook computer will be illustrated. It should be understood that reference marks in FIG. 8 identical with FIGS. 1 through 7 indicate identical or equivalent components.

Figure 8:
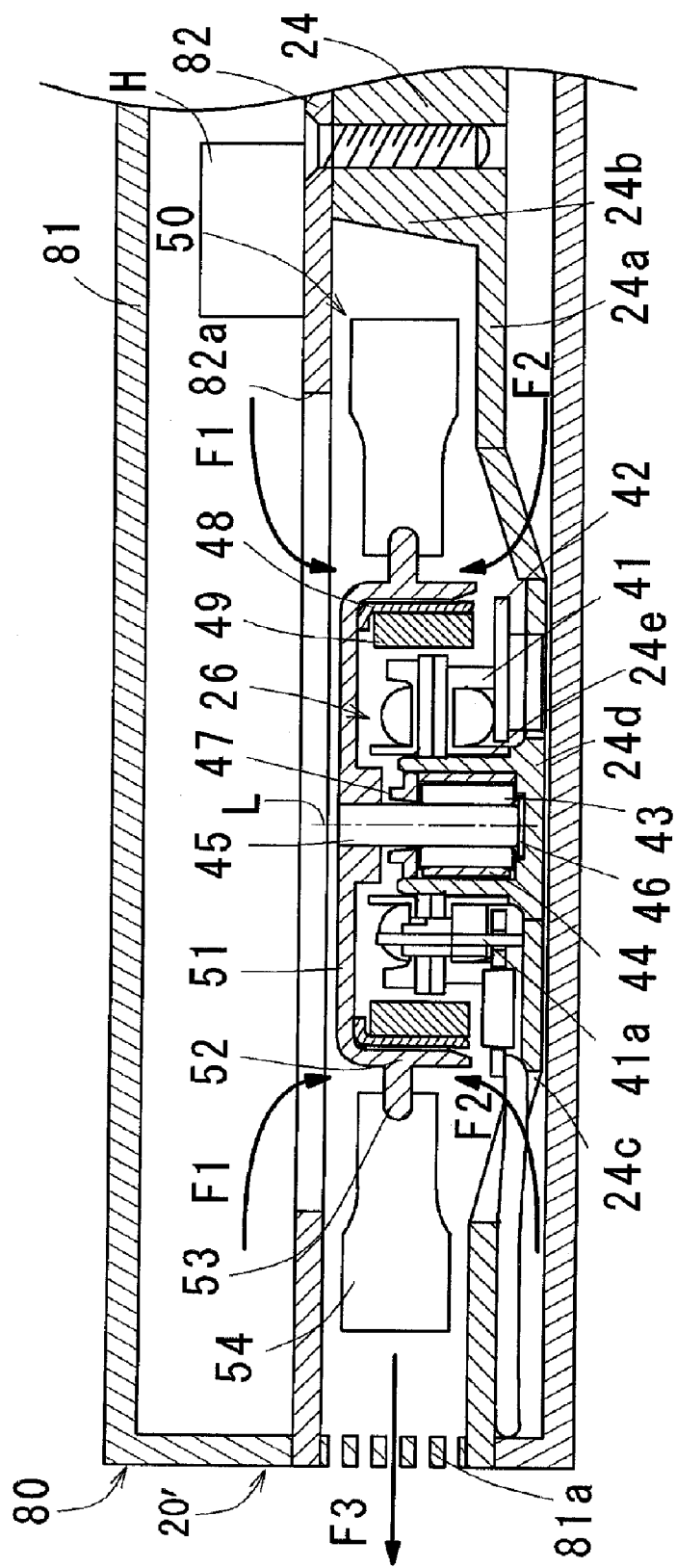
FIG. 8 is a fragmentary sectional view illustrating a centrifugal fan in a second embodiment of the present invention.
Figure 9:
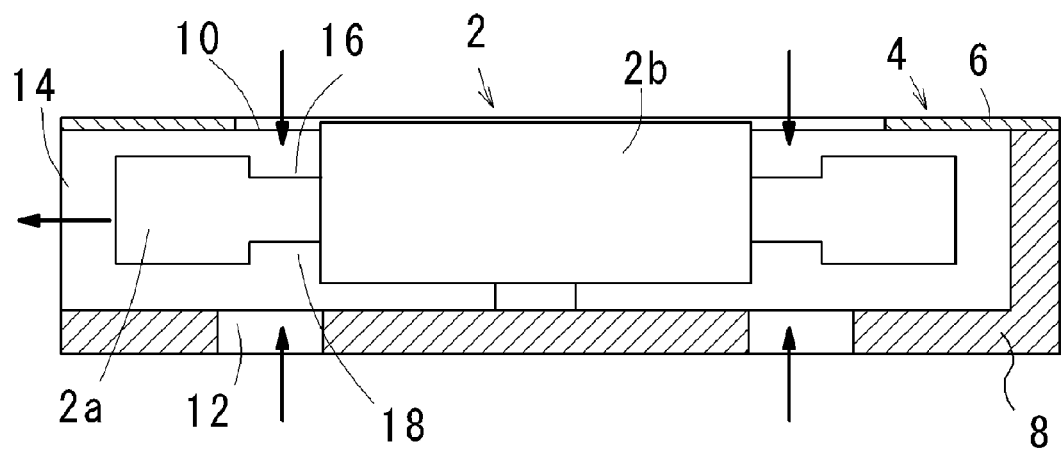
FIG. 9 is a sectional view illustrating a conventional centrifugal fan.

The above-described centrifugal fan 20, with the configuration of the housing 22 partially modified, is installed in the information device 80 illustrated in FIG. 8. (This centrifugal fan will be indicated by reference mark 20' hereinafter.) A motherboard 82, on which a plurality of electronic parts H, including a CPU, and the centrifugal fan 20' are loaded, is disposed within an outer frame 81. The centrifugal fan 20' is employed for cooling the electronic components H. In the centrifugal fan 20', the motherboard 82 is used in place of the top-side plate of the centrifugal fan 20 illustrated in FIG. 1. A round opening 82a that is similar to the intake port 23a in the top-side plate 23 depicted in FIG. 1 is formed in the motherboard 82. The centrifugal fan 20' is attached to the underside of the motherboard 82 in a manner so that the center of the opening 82a coincides with the fan's rotational axis. Accordingly, the motherboard 82 closes over the upper part of the bottom-side plate 24 of the centrifugal fan 20', and the opening 82a becomes an upper-side intake port. The exhaust port 81a in the centrifugal fan 20' is positioned to align with an opening fitted with a grill in a lateral side of the outer frame 81. The centrifugal fan 20' is of essentially the same configuration as that of the centrifugal fan 20 illustrated in FIG. 1, and performs equivalently and exhibits equivalent effects.

Because the information device 80 is made flattened and, at the same time, is densely populated with the numerous electronic components H, air space in the interior of the outer frame 81 is extremely scarce. Under these circumstances, owing to its thin-profile structure, the centrifugal fan 20' installs readily, even in a space where the thickness dimension is restricted.

Yet in the space surrounding where the centrifugal fan 20' is disposed, the electronic components H and the outer frame

81, outside both the intake port 82*a* and the intake ports 24*c*, are in a close, proximate positional relationship, wherein the fluidity of the air is poor. Nevertheless, even in such an environment, because the centrifugal fan 20' can be spun at higher speed, air can be smoothly taken into the blades 54 as noted earlier, making it possible to cool the electronic components H adequately.

Accordingly, while the structure of this information device 80 is kept to a slender profile, the device can cool adequate despite its employing high-performance electronic components that emit a great amount of heat. Therefore, this information device 80 enables the realization of a flattened design and enhanced performance at the same time.

Although in the foregoing, single embodiments of a centrifugal fan and an information device according to the present invention have been described, the present invention is not limited to these embodiments, and various modifications within a scope that does not deviate from the gist of the invention are possible.

The blades 54 may have curved surfaces that in longitudinal extension describe curved lines, and may be inclined with respect to the fan's rotational axis. Further, the exit angle α1 and the entrance angle α2 may be altered.

Another possible modification is that although the centrifugal fans 20 and 20' are configured with the upper and lower intake ports 23 (82*a*) and 23*c*, the fans may be configured with only the one or the other.

Another alternative is that for the air-generating component 50, although the disk portion 51, the cylindrical portion 52, the posts 53, and the blades 54 are formed as a unit from a synthetic resin, the cylindrical portion 52, the posts 53, and the blades 54 can be integrally formed from a synthetic resin, and the part corresponding to the disk portion 51 can be replaced with a modified version of the yoke 48.

Likewise, although the centrifugal fans 20 and 20' are separated from the heat-emitting body of components, a heat-dissipating part may be provided on part of the housing 22, and disposed so as to enable the heat-emitting body of components to conduct heat either directly or indirectly to the heat-dissipating part.

In addition, although the surfaces of the blades 54 parallel to the rotational axis orientation are flat, according to how their design takes air fluidity characteristics into consideration, they may be slanted with respect to the rotational axis orientation or may be curved surfaces. In a related modification, the blades 54 can be formed to have a minor portion in which only the inner-diameter side of the blades 54 is slanted with respect to the rotational axis orientation.

What is claimed is:

1. A slim-profile centrifugal fan comprising:
   a housing;
   a motor component supported in said housing, said motor component having
   a stator and a rotary section, furnished with a rotor magnet, rotative about a rotational axis; and
   an airflow-generating component fixed to said rotary section, said airflow-generating component having
   a disk portion centered on the rotational axis and defining an axial upper end of said airflow-generating component,
   a cylindrical portion extending down from the rim of said disk portion,
   a plurality of circumferentially evenly spaced posts projecting outward, orthogonal to the rotational axis, from the outer circumferential surface of said cylindrical portion and
   blades each fixed to a respective outer peripheral end of each of said posts, said airflow-generating component being configured so that, with the rotational axial height of said posts being d1, the circumferentially circumscribed width of said posts orthogonal to the height d1 being e1, the thickness of said blades being d2, and the rotational axial height of said blades in the vicinity of the portion of said blades that is fixed to the posts being h3, then d1<h3 and e1>d2.

2. A centrifugal fan as set forth in claim 1, wherein:
   said rotor magnet is provided on the inner circumferential surface of said cylindrical portion;
   said stator is disposed inside a space enclosed by said disk portion and said cylindrical portion, and opposes said rotor magnet; and
   with the rotational axial height of said cylindrical portion being h1 and the radius to the outer circumferential surface of said cylindrical portion being r, said cylindrical portion satisfies the relation h1<r.

3. A centrifugal fan as set forth in claim 2, wherein:
   said posts are oriented so that the center axial line passing through said posts in the direction that said posts project from the outer circumferential surface of said cylindrical portion will be at a predetermined angle with respect to a line extending the cylindrical-portion radius that passes through the intersection of the center axial line and the outer circumferential surface of said cylindrical portion in a plane containing the center axial line and the radius.

4. A centrifugal fan as set forth in claim 3, wherein with a horizontal plane containing the upper surface of said disk portion being a reference plane, said blades are disposed so as not to extend beyond the reference plane.

5. A centrifugal fan as set forth in claim 4, wherein said airflow-generating component, said disk portion, said posts, and said blades are formed integrally from a synthetic resin.

6. A centrifugal fan as set forth in claim 5, wherein:
   said blades have a minor-width portion defined by the rotational-axial height h3, and a major-width portion where the blades extend longitudinally outward from their joint with said posts; and
   are configured so that, with the rotational-axial height of the major-width portion being h2, said blades satisfy h3<h2.

7. A centrifugal fan as set forth in claim 6, wherein the major-width portion of said blades satisfies h2<h1.

8. A centrifugal fan as set forth in claim 6, wherein with the rotational-axial height of said motor component being h4, the major-width portion of said blades satisfies h1<h2<h4.

9. A centrifugal fan as set forth in claim 1, wherein:
   the rotational-axial height h3 of said blades is at least approximately twice the rotational axial height d1 of said posts; and
   the circumferentially circumscribed width e1 of said posts is at least approximately twice the thickness d2 of said blades.

10. A centrifugal fan as set forth in claim 9, wherein:
    said rotor magnet is provided on the inner circumferential surface of said cylindrical portion;
    said stator is disposed inside a space enclosed by said disk portion and said cylindrical portion, and opposes said rotor magnet; and
    with the rotational axial height of said cylindrical portion being h1 and the radius to the outer circumferential surface of said cylindrical portion being r, said cylindrical portion satisfies the relation h1<r.

11. A centrifugal fan as set forth in claim 10, wherein:
said posts are oriented so that the center axial line passing through said posts in the direction in which said posts extend longitudinally will be at a predetermined angle with respect to a line extending the cylindrical-portion radius that passes through the intersection of the center axial line and the outer circumferential surface of said cylindrical portion in a plane containing the center axial line and the radius.

12. A centrifugal fan as set forth in claim 11, wherein with a horizontal plane containing the upper surface of said disk portion being a reference plane, said blades are disposed so as not to extend beyond the reference plane.

13. A centrifugal fan as set forth in claim 12, wherein said airflow-generating component, said disk portion, said posts, and said blades are formed integrally from a synthetic resin.

14. A centrifugal fan as set forth in claim 13, wherein:
said blades have a minor-width portion defined by the rotational-axial height $h3$, and a major-width portion where the blades extend longitudinally outward from their joint with said posts; and
are configured so that, with the rotational-axial height of the major-width portion being $h2$, said blades satisfy $h3<h2$.

15. A centrifugal fan as set forth in claim 14, wherein the major-width portion of said blades satisfies $h2<h1$.

16. A centrifugal fan as set forth in claim 14, wherein with the rotational-axial height of said motor component being $h4$, the major-width portion of said blades satisfies $h1<h2<h4$.

* * * * *